United States Patent [19]

Seaman et al.

[11] Patent Number: 4,774,760

[45] Date of Patent: Oct. 4, 1988

[54] METHOD OF MAKING A MULTIPAD SOLDER PREFORM

[75] Inventors: Ronald J. Seaman; Keith A. Vanderlee, both of Austin, Tex.

[73] Assignee: International Business Machines Corporation, Armonk, N.Y.

[21] Appl. No.: 110,070

[22] Filed: Oct. 9, 1987

Related U.S. Application Data

[63] Continuation of Ser. No. 859,974, May 5, 1986, abandoned.

[51] Int. Cl.[4] .............................................. H05K 3/34
[52] U.S. Cl. .................................... 29/840; 228/56.3; 228/246
[58] Field of Search ................. 29/840; 228/56.3, 245, 228/246

[56] References Cited

U.S. PATENT DOCUMENTS

| | | | |
|---|---|---|---|
| 3,396,894 | 8/1968 | Ellis | 228/56 |
| 3,591,922 | 7/1971 | Pardee et al. | |
| 3,634,807 | 1/1972 | Grobe et al. | 174/68.5 X |
| 3,750,252 | 8/1973 | Landman | 29/191.6 |
| 3,750,265 | 8/1973 | Cushman | 29/471.3 |
| 3,932,934 | 1/1976 | Lynch et al. | 228/246 X |
| 4,050,621 | 9/1977 | Bouley | 228/180 |
| 4,209,893 | 7/1980 | Dyce et al. | 228/56.3 X |
| 4,216,350 | 8/1980 | Reid | 174/68.5 |
| 4,557,411 | 12/1985 | Farquharson et al. | 228/56.3 |

FOREIGN PATENT DOCUMENTS 133752  3/1985  European Pat. Off. ........... 228/56.3

OTHER PUBLICATIONS

Surface Mount Technology, International Society for Hybrid Microelectronics, pp. 205-218, pp. 221-226.
Printed Board Dimensions and Tolerances, ANSI/IPC-D-300G, A Standard Developed by the Specification Subcommittee of the Rigid Single and Double Sided Printed Board Committee of the Institute for Interconnecting and Packaging Electronic Circuits, The Institute for Interconnecting and Packaging Electronic Circuits pp. 496-506.
IBM Technical Disclosure Bulletin, vol. 13, No. 8, 1/71, pp. 23-30, "Etched Braze Preform Sheet" to Koop et al.

*Primary Examiner*—Howard N. Goldberg
*Assistant Examiner*—Carl J. Arbes
*Attorney, Agent, or Firm*—Andrea P. Bryant

[57] ABSTRACT

A solder preform and technique for making same is disclosed for use in a one time flux process for attaching electronic modules to printed circuit substrates via plated through holes or surface mount pads.

4 Claims, 3 Drawing Sheets

METHOD OF MAKING A MULTIPAD SOLDER PREFORM

This is a continuation of application Ser. No. 859,974 filed May 5, 1986, now abandoned.

DESCRIPTION

1. Technical Field

The present invention relates to attaching circuit devices to circuit board substrates. More particularly, it relates to a method of attaching devices using a single multipad solder preform in a simplified process having a single fluxing step.

2. Background Art

Conventional methods for assembling modules such as pin grid arrays in a surface soldered or reflow soldered package require either fluxing and then placement of individual solder preforms on each pad of the array or an additional wave soldering operation following the reflow soldering required for other surface mount devices.

The prior art offers many ways of applying solder to a plurality of sites. For example, U.S. Pat. No. 4,216,350 to Reid teaches a web of non-fusible material having a plurality of apertures homologous with those of terminals to be soldered to a circuit board to hold within the respective apertures of individual solder rings. The web loaded with the rings permits disposition of a large number of solder rings at one time upon the corresponding terminals.

U.S. Pat. No. 3,396,894 to Ellis teaches applicator for simultaneous application of a plurality of solder bodies or other heat fusible material. The applicator contains the plurality of solder bodies disposed in individual heat recoverable cups.

IBM *Technical Disclosure Bulletin*, Vol. 13, No. 8, January 1971, page 2320 to Koop et al discloses an etched braze preform sheet for brazing solder bucket connectors to metalized ceramic circuit module substrates. The preform comprises a sheet of brazing alloy stock with portions etched away leaving preforms not strongly connected to each other, these preforms corresponding to metalized pad locations on the ceramic module.

None of these references addresses the particular problems associated with attaching pin grid array modules or other multi-leaded modules to plated through holes or surface mount pads in a printed circuit substrate being soldered in a reflow soldering process. For example, Koop et al requires the application of the brazing material followed by another operation to attach pins or the like. The Ellis reference teaches one time application of solder to connect a plurality of pins to a printed circuit substrate, but requires the removal of the applicator only after the solder has cooled. The Reid reference teaches the requirement of placing the individual solder preforms into a carrier web.

DISCLOSURE OF THE INVENTION

The present invention provides a method of attaching a component to a circuit board substrate using a multipad solder preform requiring only a single flux step. The solder preform has apertures stamped in a predetermined pattern corresponding to the module leads and mounting pads or plated through holes (PTH) in the printed circuit substrate. The preform is sandwiched between the substrate and the module to be attached, fluxed and reflowed. When the solder preform melts separation at the perforations occurs. Surface tension and solder wetting cause the solder near any given module lead to flow to that lead and the pad or PTH on which that lead rests. A predetermined amount of solder flows to each lead and pad or plated through hole location.

Liquid flux appropriate to the solder composition is applied before the reflow operation. The solder preform may be properly located with respect to the module and its associated pads or PTHs by providing the preform with undersized, that is smaller than the pins on the module, holes at two or more corner pin locations. An interference fit results from slightly forcing the locating holes in the preform over the associated pins on the module to be attached.

Solder volume available at any given pin location is determined by selecting the thickness of the preform as a function of hole size and shape and lead size and shape required, solder fillet size, and pad size and shape. The perforations are stamped in the preform in a pattern selected as a function of the volume of solder required, pin location and density, presence of circuit lines between the pads among other parameters.

BRIEF DESCRIPTION OF THE DRAWING

The above and other features and advantages of the present invention will become more apparent upon reference to the following description taken in connection with the drawing in which.

BEST MODE FOR CARRYING OUT THE INVENTION

Figure 1:
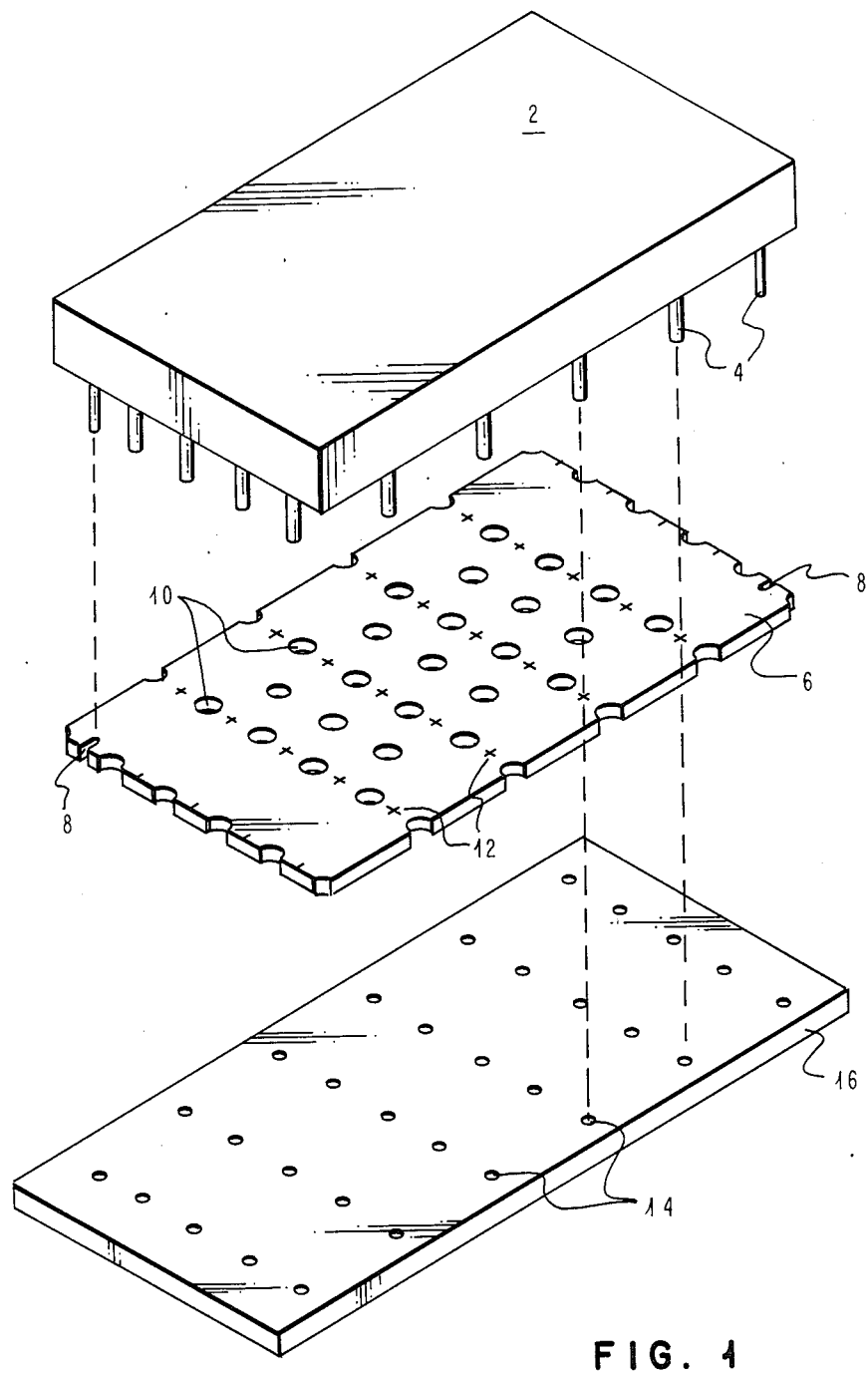
FIG. 1 is an exploded view of a pinned grid array module in alignment with a multiple pad preform made in accordance with the present invention adjacent a section of a printed circuit substrate.

In FIG. 1 pin grid array module 2 has pin leads 4 which are required to be reliably attached to a printed circuit board. Solder preform 6 is provided optionally with two undersized holes 8 which achieve an interference fit with corner ones of pins 4 in module 2 for proper alignment. Additionally, a pattern of perforations 10 of predetermined diameter is provided in preform 6. The x's 12 represent the centers of the solder area which will form a bond with pins 4 and the pads or plated through holes (PTH) 14 in the printed circuit substrate 16 board.

The perforations 8 and 10 in preform 6 may be formed using a conventional mechanical punch. It will be understood by those skilled in the art that dies corresponding in size, shape and location to the predetermined hole pattern are required.

Figure 2:
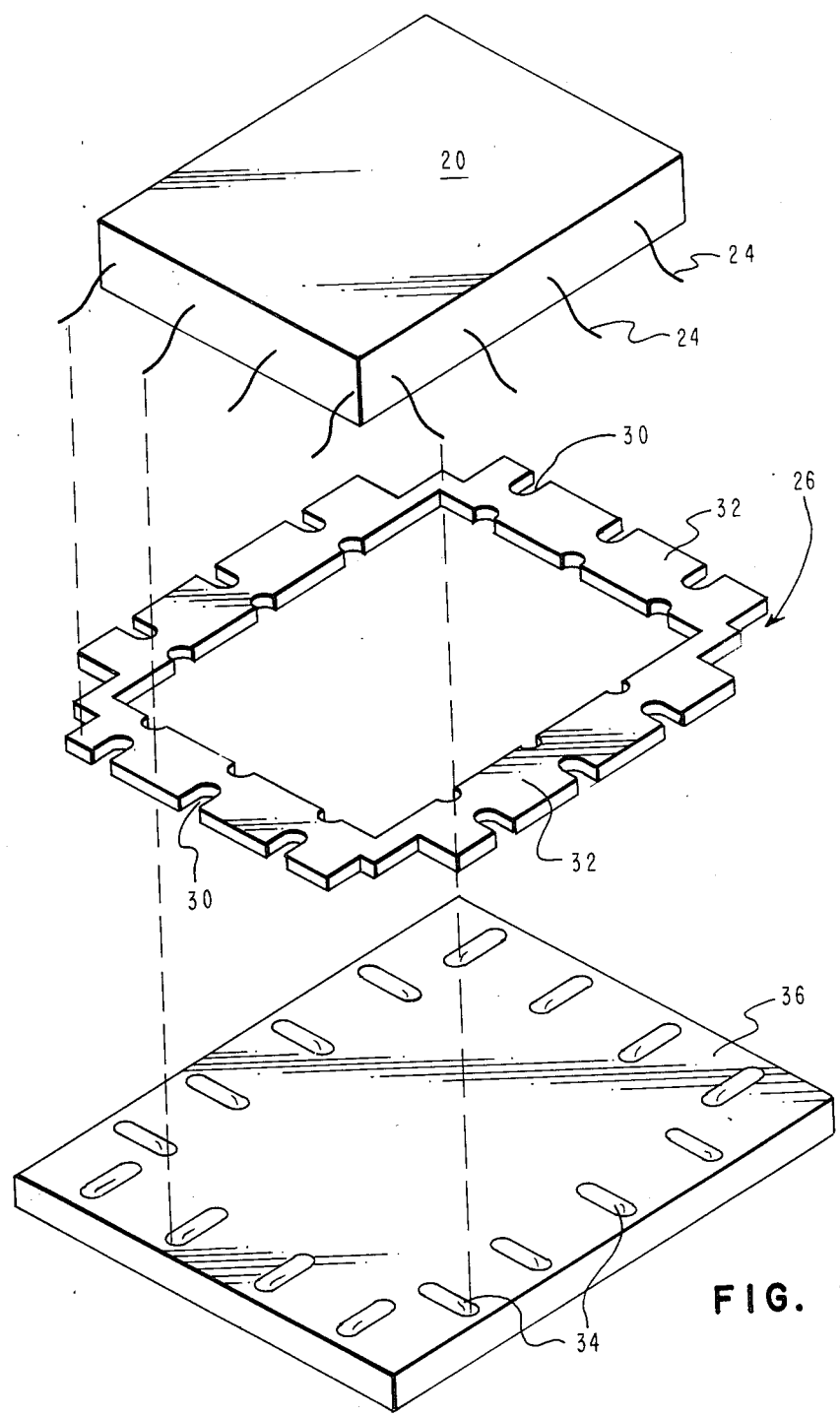
FIG. 2 is an exploded view of a module with gull wing leads. a solder preform and a portion of a printed circuit substrate.

FIG. 2 is similar to FIG. 1 and shows the applicability of the invention to surface mount technology. Module 20 is a plastic leaded chip carrier (PLCC) or other flat pack device having gull wing leads 24. Solder preform 26 has punched out areas 30 adjacent solid areas 32 corresponding to the locations of leads 24 which are also in alignment with surface mount pads 34 in printed circuit substrate 36.

Figure 3:
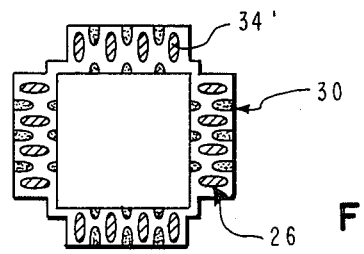
FIG. 3 is a top view of the multipad preform shown in FIG. 2.

FIG. 3 is a top view of the multipad preform 26 shown in FIG. 2 and indicates the geometric relationship between the punched out areas 30 and surface mount pads 34. The areas 34 prime correspond to the surface mount pads 34 shown on substrate 36 in FIG. 2.

The process of the present invention provides for choosing the preform thickness and perforation pattern as a function of component dimensions, circuit substrate geometry and desired solder fillet dimensions. Conventional techniques are used for forming that pattern. The preform is then sandwiched between the component to be attached and the circuit board in proper alignment which may be facilitated with the use of locating holes. It is to be noted that the preform may be fluxed before it is placed on the printed circuit board. A reflow solder operation follows, and as the preform 6 or 26 (FIGS. 1 and 2) becomes molten it separates at holes 10 or cut away areas 30. Surface tension causes the solder near any given pin 4 or lead 24 to flow thereto and the pad 14 or plated through hole 34.

It can be seen that it is very critical to properly choose the thickness of the preform and size of the holes in the preform. The calculation of the appropriate thickness and hole size may be accomplished as described below.

Figure 4:
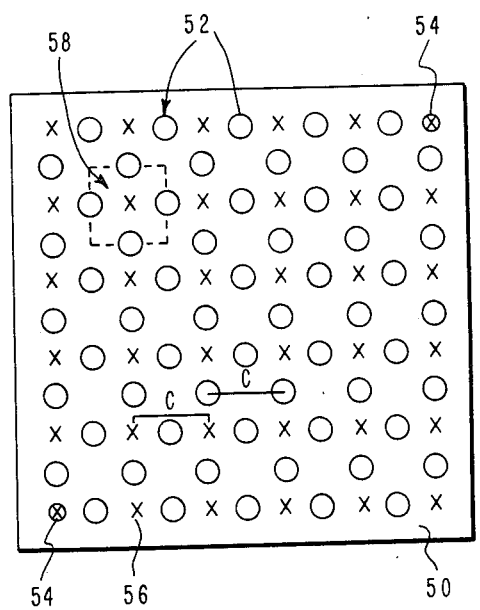
FIG. 4 is a schematic top view of a preform used with leaded components.

Refer to FIG. 4 which is a schematic representation of a solder preform 50 in accordance with the invention. Holes 52 are formed in a pattern surrounding x's 56 representing component lead locations. The maximum size of the holes 52 in preform 50 is given by:

$$S = \frac{\sqrt{2}}{4} C$$

where
C = pin to pin spacing which is the same as the hole to hole spacing in the same direction;

S = radius of a hole 52 in the preform.

It is necessary to calculate the volume of solder required to fill the hole, if one is present, cover the pad, and produce fillets on the lead. This calculation involves known variables such as the pin to pin spacing, and the size and shape of the pin, and pad.

The next requirement is the determination of the volume of solder available per lead. This result is a function of the preform thickness and the hole size.

Next, equate the volume of solder required to the volume of solder available. The result is an equation containing the thickness of the preform and the size of the holes as a function of known quantities: the size and shape of the hole, pad, and lead (or pin), and the pin to pin spacing.

It has been found that optimum preform performance occurs when S is chosen to be between ⅓ and 9/10 times its maximum possible value. The thickness is calculated using the equation derived above and the selected value of S.

Generally, solder in sheet form is available in standard sizes. If desired, a standard thickness may be selected and a value of S calculated from the above derived equation. The value of S thus calculated must fall between ⅓ and 9/10 times the thickness must be selected.

Figure 5:
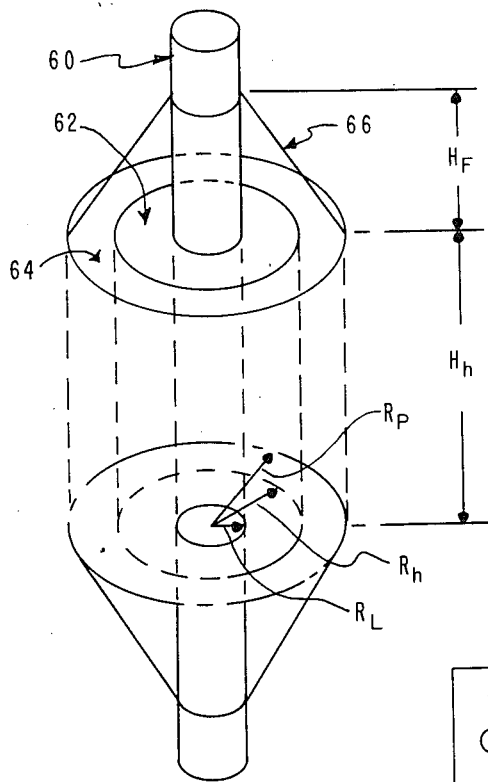
FIG. 5 is a schematic illustration of the relationship of solder fillet to module lead to plated through hole or pad size.

An exemplary determination of multipad preform thickness will be described in connection with FIG. 5 which schematically shows a single cylindrical lead 60, a cylindrical plated through hole 62, a circular pad 64 and a frusto-conical solder fillet 66. Assume the following dimensions for one lead and pad.

$R_L$ = radius of lead 60
$R_h$ = radius of PTH 62
$R_p$ = radius of pad 64
$H_F$ = height of fillet 66
$H_h$ = height of hole = thickness of the circuit substrate
Step 1—calculation of required solder volume $V_F$ = Volume of solder + lead in one fillet
$= (\pi/3) H_F (R_L^2 + R_p^2 + R_L R_p)$ $V_h$ = Volume of solder + lead in PTH = $\pi H_h R_h^2$ $V_L$ = Volume of lead covered by
solder = $\pi R_L^2 (H_h + 2H_f)$ There are fillets on both the top and bottom of the card.

Total volume $V_T$ of solder required equals the volume of 2 fillets plus the volume of the PTH less the volume of the lead covered by solder.

$$V_T = 2V_F + V_h - V_L$$

$$2V_F + V_h - V_L = \pi/3 [2H_F R_p^2 + 2H_F R_L R_p + 3H_h(R_h^2 - R_L^2) - 4H_F R_L^2]$$

Step 2—calculation of available preform volume

Refer again to FIG. 4. Each x 56 represents the location of a module pin. Each hole 52 is stamped, punched or otherwise formed in the preform 50. Optional locating holes are indicated at 54. The solder within the dotted square 58 is available to flow toward a pin located at the x 56 at its center.

The preferred preform geometry is that shown in FIG. 4. Holes 52 are located at sites corresponding the spaces between adjacent pad or PTH locations in a circuit substrate. As illustrated the preferred ratio of holes to pads/PTHs is 2:1, i.e., there are two holes 52 associated with each x 56.

Let
C = hole to hole center distance
S = radius of hole 52 cut in preform
T = thickness of preform The volume ($V_A$), of solder available at each PTH is a square volume with sides equal to the hole 52 to hole 52 center distance less the volume of the four half circles at the middle of the sides of this square which have been punched out times the thickness of preform 50.

$$V_A = [C^2 - 4(\tfrac{1}{2}\pi S^2)]T = [C^2 - 2\pi S^2]T$$

Step 3—equating the available volume $V_A$ with the required volume $V_T$ and solving for the thickness T of the preform.

$$V_A = 2V_F + V_h - V_L$$

$$T = \frac{\pi/3 [2H_F R_p^2 + 2H_F R_L R_p + 3H_h(R_h^2 - R_L^2) - 4H_F R_L^2]}{C^2 - 2\pi S^2}$$

Using this equation, S and T may be calculated. The allowable values S are between ⅓ and 9/10 times the maximum possible value of S. The allowable values of T are restricted only by the thicknesses of solder sheet materials available.

Those skilled in the art will appreciate that similar calculations may be performed for any particu-lar lead, pad, and PTH geometries.

Therefore, the invention provides in use, a simple way of assuring the proper volume of solder to join leads to PTHs or surface pads. For a given card/board population application, the calculation of thickness occurs once as does the design of the die or other means for making the holes in the preform. This technique lends itself to mass production methods for making preforms.

Preforms made in accordance with the present invention may be placed with accuracy and reliability on circuit board substrates using conventional program controlled placement apparatus.

While the invention has been described having reference to a preferred embodiment, various changes in form and detail may be accomplished without departing from the scope and spirit of the invention.

What is claimed is:

1. A method of soldering leaded electronic components to printed circuit substrate comprising:

providing a substantially solid multipad solder preform of predetermined thickness with a plurality of perforations at locations in a pattern complementing the pattern of locations of leads on the components, said perforations being in number at a ratio of substantially 2:1 to the number of leads per component to be soldered, said providing step including determining the thickness of the preform, and perforation shape, size and spacing as a function of the component lead size, shape and spacing, substrate land dimensions and desired solder fillet dimensions, and calculating the perforation size, to be in a range of about 0.33 to about 0.90 of its maximum where its maximum equals $\sqrt{2}/4$ times lead to lead distance;

fluxing the perform;

sandwiching the preform between the component and the printed circuit substrate so as to align the component leads, non perforated preform areas, and lands on the substrate; and reflowing the solder.

2. The method of claim 1 wherein the providing step additionally includes providing at least two locating holes in the preform of a diameter less than that of the leads of the component to be attached.

3. A method of making a multipad solder preform for mounting a pinned component having uniform pin to pin spacing to circuit boards having metallized through holes comprising:

determining the planar dimensions of a solid solder blank having an area corresponding to the planar configuration of the component;

forming holes in the solder blank at locations surrounding areas corresponding to component pin locations, said forming step including calculating optimum hole radius size to be in a range from about 0.3 to about 0.9 of its maximum where its maximum equals the square root 2 of divided by 4 times the pin to pin spacing and selecting the locations to be at a ratio of substantially 2:1 to the number of pins on the component; and choosing the thickness and hole diameter as a function of pin size, shape and spacing, pad size and shape, and desired solder fillet size and shape.

4. The method of claim 3 including the additional step of forming at least two additional, undersized locating holes in the blank at locations corresponding to pins on the component.

* * * * *